United States Patent [19]
Heck

[11] Patent Number: 5,389,839
[45] Date of Patent: Feb. 14, 1995

[54] INTEGRATABLE DC BLOCKING CIRCUIT

[75] Inventor: Joseph P. Heck, Ft. Lauderdale, Fla.

[73] Assignee: Motorola, Inc., Schaumburg, Ill.

[21] Appl. No.: 25,517

[22] Filed: Mar. 3, 1993

[51] Int. Cl.[6] ............... H03F 1/34; H03K 5/08; H04L 25/06
[52] U.S. Cl. .................. 327/307; 327/551; 327/552; 327/553
[58] Field of Search ........... 307/264, 259, 491, 520, 307/521, 522; 358/171

[56] References Cited
U.S. PATENT DOCUMENTS

| | | | |
|---|---|---|---|
| 4,334,185 | 6/1982 | Turney et al. | 307/264 |
| 4,377,759 | 3/1983 | Ohhata et al. | 307/264 |
| 4,852,126 | 7/1989 | Tanaka et al. | 307/359 |

OTHER PUBLICATIONS

IEEE Journal of Solid State Circuits, vol. 24, No. 3, pp. 651–658 published Jun. 1989.

Primary Examiner—William L. Sikes
Assistant Examiner—Fetsum Abraham
Attorney, Agent, or Firm—M. Mansour Ghomeshi

[57] ABSTRACT

An electronic circuit (100) includes an output (110) and a filter circuitry (104, 106 and 108) coupled across this forward transmission path is a feedback loop having an error amplifier (112) and a coupling amplifier (116). Switches (118, 120, 122, and 124) are situated around the error amplifier to form an auto zero circuit. A capacitor (114) in conjunction with the error amplifier (112) provides an integrator for the circuit (100). The auto zero circuit allows the output (110) to follow a desired DC voltage namely (VAG) independent of the offset voltage of the error amplifier (112) or the coupler amplifier (116).

17 Claims, 3 Drawing Sheets

INTEGRATABLE DC BLOCKING CIRCUIT

TECHNICAL FIELD

This invention is generally related to Direct Current (DC) blocking circuits and more particularly to integrated DC blocking circuits.

BACKGROUND

In many circuit applications it is necessary to achieve AC coupling of signals. This may be necessary to keep the signal centered within the allowable voltage swing range to prevent clipping and/or to eliminate any unwanted DC component of the signal. Typically, elimination of the DC component is done by using a coupling capacitor feeding into a resistive load. This does not achieve centering of the signal swing ahead of the capacitor. However, for very low frequency coupling, the resistor and/or capacitor must be large. This in itself may prevent practical integration on an IC. In addition, the required level of residual DC offset for stringent applications, such as in a Direct Conversion baseband IF, may be so low that the required level cannot be achieved by conventional active circuit techniques.

In some applications it has been necessary to add coupling capacitors between $V_{out}$ and the input to the up mixers in order to eliminate the offset of the error amplifier to insure that the DC offset is below about 0.1 mV. In such applications, the offset correction loops keeps $V_{out}$ centered at analog ground to prevent signal clipping, but the residual offset is not low enough to avoid the need for the coupling capacitors.

In yet other applications, the problems are solved by combining the use of coupling capacitors to eliminate the DC component at the output, plus an offset correction circuit ahead of the coupling capacitors to maintain signal swing centering. Two long time constants are generated with that approach (the coupling capacitor time constant and the offset correction time constant) each of which may be a source of unwanted transient responses when the baseband DC level changes due to varying signal levels, etc.

It is, therefore, desired to have an electronic circuit with DC blocking that is independent of offset voltages that are inherent in integrated circuits.

SUMMARY OF THE INVENTION

Briefly, according to the invention, an electronic circuit having an output is disclosed. The circuit comprises a forward transmission path an a feedback means coupled across the transmission path. The feedback means includes an error amplifier with an inherent offset voltage. An auto-zero circuit is used to force the output of the circuit to accurately follow a desired DC voltage independent of the offset voltage.

DETAILED DESCRIPTION OF THE PREFERRED EMBODIMENT

Figure 1:
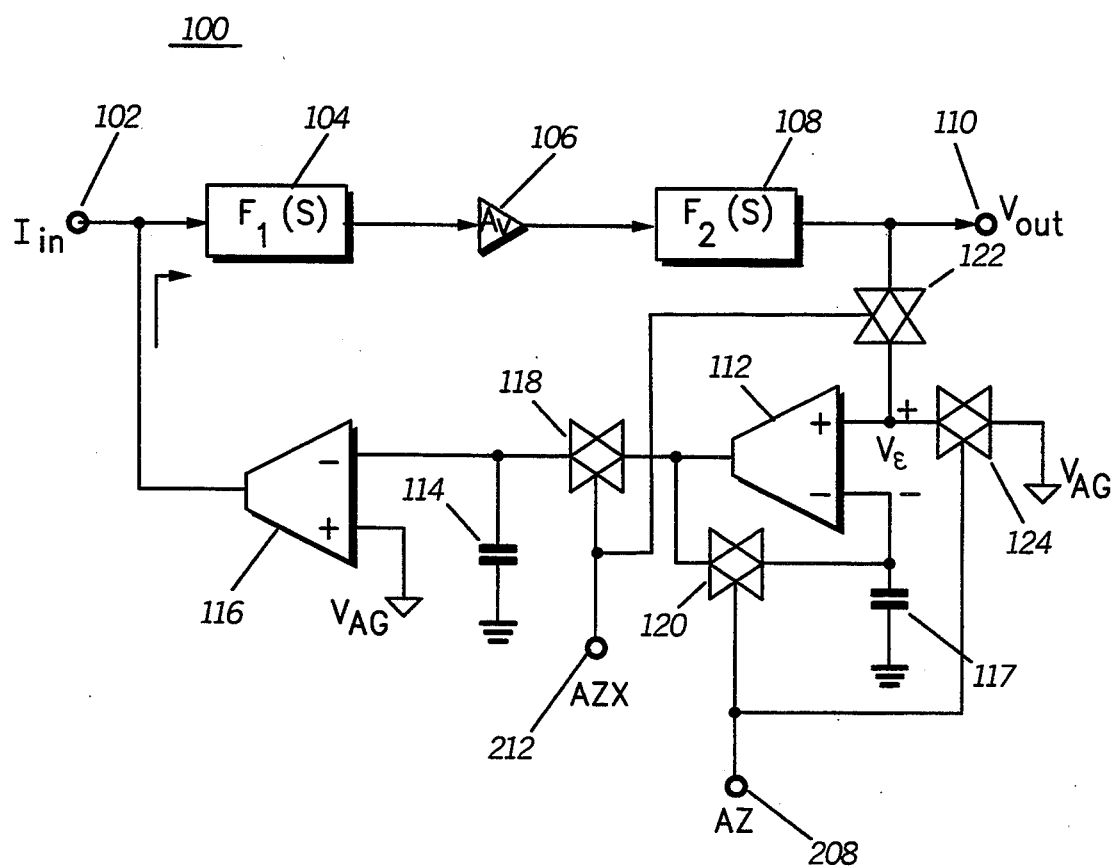
FIG. 1 is a block diagram of an electronic circuit in accordance with the present invention.

Referring to FIG. 1, a block diagram of an electronic circuit 100 utilizing Direct Current (DC) blocking in accordance with the present invention is shown. The circuit 100 includes a forward transmission path and a feedback loop coupled across this path. In the preferred embodiment, the forward transmission path is a low pass filter comprising filters 104 and 108 coupled to each other via an amplifier 106. The input to the circuit 100 is a signal current and the output is a signal voltage. The use of current input devices eliminates the need for a voltage summer or a combiner at the input. The output voltage is compared with a fixed voltage reference (the analog ground voltage, $V_{AG}$) in an error amplifier 112. The difference of the output signal from the reference voltage $V_{AG}$ is amplified and integrated in the error amplifier 112 and integrator capacitor 114, and a correction current is generated in a second amplifier 116 based on the integrated error signal. The amplifier 116 provides the coupling of the error signal to the input. The integrator provides virtually infinite gain at DC and thus removes any DC offset relative to $V_{AG}$ at the output 110 except for the input offset voltage of the error amplifier 112, $V_E$. The offset correction loop introduces a first order high pass response in the transfer function of $V_{out}/I_{in}$, which is determined by the loop gain and the value of the integrator capacitor 114. This offset correction technique will maintain the output voltage 110 close to the analog ground reference $V_{AG}$, but as indicated above, only to within the input offset voltage, $V_E$ of the error amplifier 112. Without special techniques, it is not practical to obtain offset voltages below the range of 1 to 5 mV in an IC implementation.

An auto-zero type approach is used to accomplish this level of performance on an Integrated Circuit (IC). The error amplifier 112 must be disconnected periodically and switched into the auto-zero mode. In one embodiment of the present invention, an auto-zero type integrator/error amplifier 112 is periodically switched to the auto-zero mode for a short period of time only if no signal is being received. The timing for the auto-zeroing may be controlled by a microprocessor or other timing circuits. An inhibit control from the radio squelch or signal strength indicator or other means which indicates the presence of a signal may be used to trigger the switching of the auto-zero operation. During the auto-zero period, the integrator capacitor 114 is disconnected from the auto-zero amplifier 112, but is left connected to the input of the second amplifier 116 and holds its voltage. In this way the required correction current generated by the second transconductance amplifier 116 is held constant during the auto-zero period, and when normal mode (non-auto-zero mode) is resumed, the correction loop will pick up very close to where it left off when the loop was opened to enter the autozero mode. It is noted that with this mechanism there will be no time lost in re-acquiring the loop to the minimum offset condition. The maximum period of time between the auto-zeroings will be on the order of at least several minutes since only the offset drift of the error amplifier 112 needs to be updated. The major portion of the error amplifier's offset will be corrected on the first auto-zero cycle at power-up. In the preferred embodiment the amplifiers 116 and 112 are transconductance amplifiers. The transconductance amplifiers are preferred for their superior integration characteristics at the error amplifier 112. In addition, the use of transconductance amplifier eliminates the need for combiners at the input. It is, however, understood that voltage amplifiers may be used to porduce similar results.

The auto-zero circuit works in the following manner: During the auto-zero mode, switches 124 and 120 are on, and switches 122 and 118 are off. The (+) input of the error amplifier 112 is connected to analog ground $V_{AG}$ (normally set at ½ the supply voltage), and the output of the error amplifier is fed back to its (—) input. The error amplifier 112 is thus connected in a unity gain mode during the autozero cycle, and the capacitor 117 is charged to a voltage equal to $(V_{AG}\text{-}V_E)$, where $V_E$ is the offset voltage of the error amplifier. Since switch 118 is off, the correction loop is open, and capacitor 114 holds the voltage at the input of the amplifier 116 constant. In the normal (non-auto-zero) mode, switches 122 and 118 are on, and switches 124 and 120 are off. Under these circumstances, the capacitor 117 retains its voltage at $(V_{AG}\text{-}V_E)$, and thus precisely compensates for the offset voltage of the error amplifier 112. The offset correction loop is closed and the DC level at the output port 110 is maintained at precisely $V_{AG}$. The particular auto-zero configuration shown is particularly advantageous for implementation using IC capacitors which must (or preferably should) have one terminal grounded. It is noted that the error amplifier 112 must have a very high input impedance, such as is achieved with MOSFET devices, in order to insure that the voltage on capacitor 117 is held constant.

Another operational mode of the present invention is to open and hold the offset correction loop at a fixed correction for true DC coupling during periods of reception in a Time Division Multiplex (TDM) or Time Division Duplex (TDD) system. In this scenario, at the beginning of the receive time slot, the correction loop would be closed (non-auto-zero mode). The auto-zero mode would be enabled, thus opening the overall correction loop, during the time slot in which the signal is to be received. At other times, the loop would be closed most of the time and would correct any DC offsets caused in the receiver which would then be ready to receive the desired signal with only minor correction to the DC level when the proper time slot is reached. Various timing schemes would be employed to insure that the auto-zero mode is entered often enough to keep the offset of the error amplifier below a specified minimum.

Figure 2:
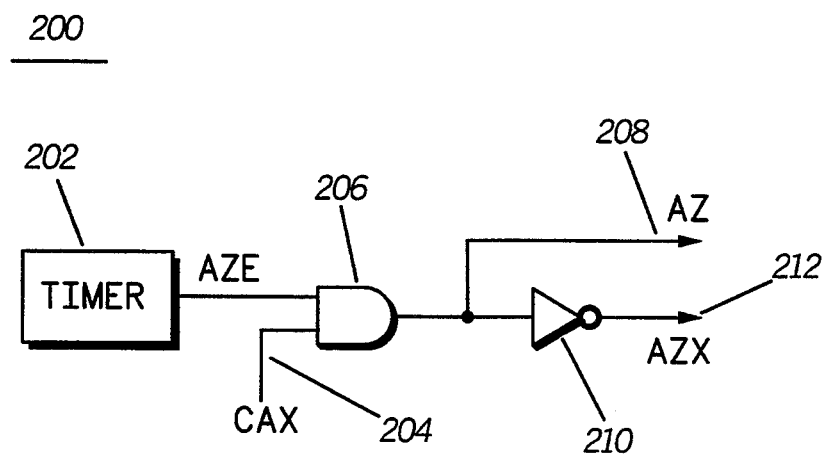
FIG. 2 is a block diagram of a timing circuit.

Referring to FIG. 2 a block diagram of a circuit 200 is shown that could be used to control the switching of the auto-zero circuit in accordance with the present invention. This figure shows how the control logic for the switching of the switches 118, 120, 122, and 124 could be configured for a non-TDM/TDD system. A timer 202, which would typically be implemented in a microprocessor, generates a pulse which enables the auto-zero mode periodically. In the preferred embodiment, this pulse is negative and is labeled AZE (for "Auto-Zero Enable"). AZE is combined in an AND gate 206 with the inverse Channel Activity indicator (CAX) 204 which is low when a received signal is present. An output 208 (AZ) enables the actual autozero mode of the circuit 100, and is high when AZE is high as long as no signal is present. An inverter 210 inverts the AZ signal to produce AZX 212. These signals, 208 and 212 are coupled to the control inputs of switches 118, 120, 122, and 124 of the circuit 100.

Figure 3:
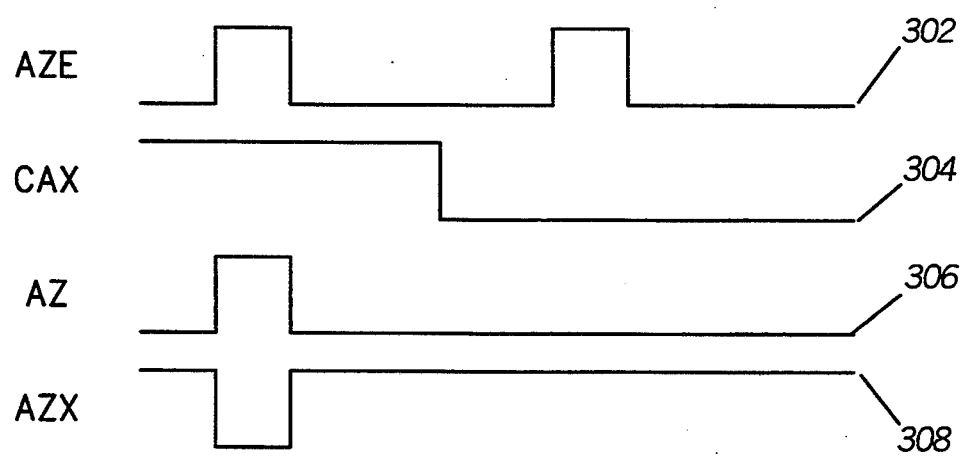
FIG. 3 shows a timing diagram to accommodate switching of the components of the electronic circuit in accordance with the present invention.

FIG. 3 shows a sample timing diagram of the relationship of the control signals AZE, AZ, CAX, and AZX. Timing block 302 represents the pulses of the AZE 304 shows the channel activity. Timing blocks 306 and 308 show the activities on the control lines to the switches 118, 120, 122, and 124.

In summary, an electronic circuit has been disclosed that would allow the DC voltage at a port, namely an output port, to closely follow a desired DC level independent of the offset voltages of integrated circuits. In other words, the principles of the present invention provide for the accurate DC coupling of a signal. An auto-zeroing circuit is used in conjunction with an error amplifier to accomplish the task of setting the DC voltage in an electronic circuit independent of the offset voltages of its integrated circuits. One of the benefits of the present invention is that it achieves AC coupling of very low signal frequencies in a practical size for IC implementation. In addition, swing centering of the signal at each circuit node is achieved without additional components.

Figure 4:
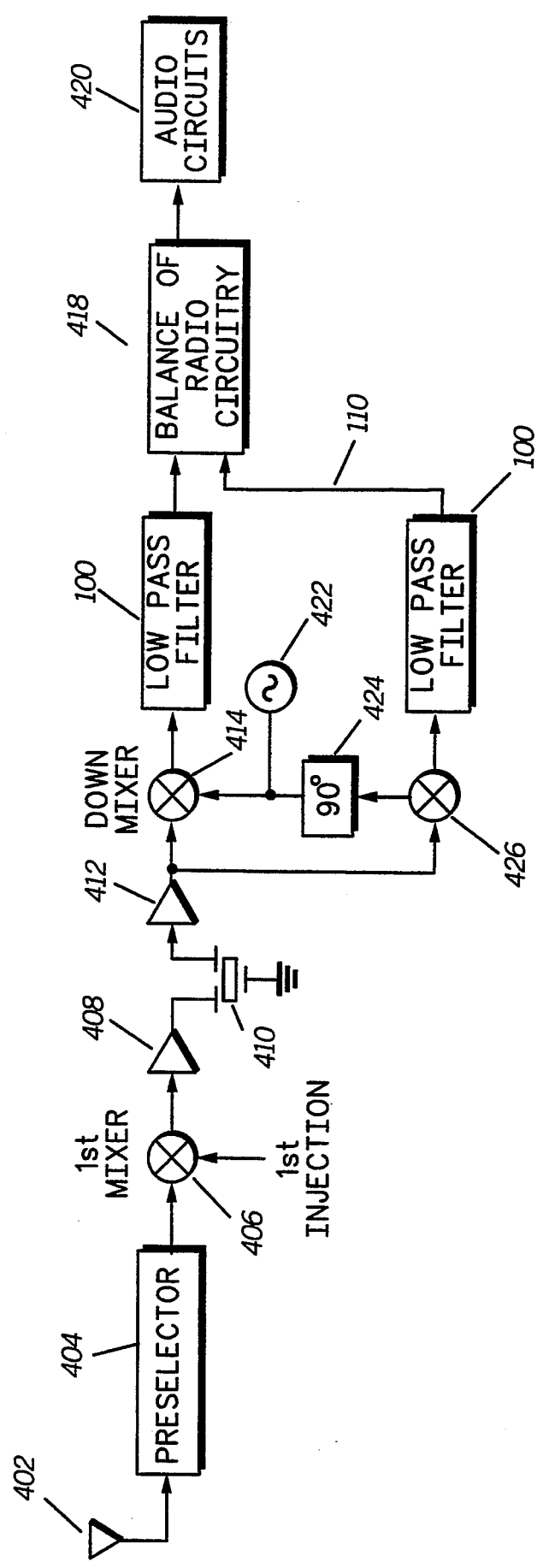
FIG. 4 is a block diagram of a communication device in accordance with the present invention.

Referring to FIG. 4, a block diagram of a communication device in accordance with the present invention is shown. A signal received at an antenna 402 is coupled to a preselector 404 for front end filtering. The output signal of the preselector 404 is coupled to a first mixer 406 having a first injection. The step down signal at the output of the mixer 406 is amplified via an amplifier 408 before being filtered at a filter 410. This filtered signal is once again amplified at a second amplifier 412 and mixed down to baseband at mixers 414 and 426. The baseband signal at the output of the mixers 414 and 426 is applied to two matched filters 100. The output signals 110 of the two filters 100 are applied to the balance of the radio circuitry 418. The DC level of the signal being applied to block 418 is strictly controlled via the principles of the present invention as explained above. The output of block 418 is coupled to the audio circuits 420 where the audio components of the received signal are recovered and presented to the user. As is seen in FIG. 4, the reference oscillator signal from the oscillator 422 to the mixer 426 is phase shifted by 90° via a phase shifter 424. This is needed to produce a base band signal.

The principles of the present invention further provide for the additional benefit of eliminating the second high pass response associated with presently used capacitors which would otherwise widen the resulting zero Hz notch in a baseband receiver. Minimizing the notch reduces distortion on the demodulated signal. Elimination of the time constant associated with the coupling capacitors also has benefit in reducing transients which affect the receiver's attack time.

Block and timing diagrams herein presented are embodiments of the present invention. These embodiments should not be construed as limitations on the present invention, rather as the means to provide an understanding of the invention. It is understood that variations could be made to these diagrams without significantly departing from the spirit of the invention.

What is claimed is:

1. An electronic circuit having an output, comprising:
a forward transmission path;
feedback means coupled across the forward path;
an error amplifier having an offset voltage; and
auto-zero circuit for forcing the output to accurately follow a desired DC voltage independent of the offset voltage.

2. The electronic circuit of claim 1, wherein the auto-zero circuit includes a plurality of switches.

3. The electronic circuit of claim 1, wherein the auto-zero circuit includes a hold capacitor.

4. The electronic circuit of claim 1, wherein the feedback means includes an integrator.

5. The electronic circuit of claim 1, wherein the forward path includes a filter.

6. An integrated circuit with Direct Current (DC) blocking, comprising:
   at least one electronic circuit having an input and an output;
   a feedback loop comprising:
      an error amplifier having an offset voltage for comparing the DC voltage level of a signal at the output with a reference voltage, the error amplifier includes an auto-zeroing circuit for producing an error signal independent of the offset voltage;
      an integrator for integrating the error signal to produce an integrated error signal; and
      a coupler for coupling the integrated error signal to the input.

7. The integrated circuit of claim 6, wherein the coupler includes a transconductance amplifier.

8. The integrated circuit of claim 6, wherein the error amplifier includes a transconductance amplifier.

9. An integrated circuit having, comprising:
   at least one integrated electronic circuit having an input and an output; and
   a feedback loop coupled from the output to the input, the feedback loop comprising:
      an error amplifier with offset voltage, including an auto-zeroing circuit for correcting out the offset voltage.

10. A fully integrated electronic circuit, comprising:
    an input;
    an output;
    a forward transmission path coupling the input to the output; and
    a feedback loop configured around the forward transmission path for forcing a signal at the output to have a desired DC voltage level, the feedback loop having an auto-zeroing circuit.

11. The integrated electronic circuit of claim 10, wherein the circuit includes a low pass filter.

12. The integrated electronic circuit of claim 10, wherein feedback loop includes an error amplifier.

13. The integrated electronic circuit of claim 10, wherein feedback loop includes an integrator.

14. The integrated electronic circuit of claim 10, wherein feedback loop includes an amplifier.

15. The integrated electronic circuit of claim 14, wherein amplifier includes a current amplifier.

16. A communication device, comprising:
    a receiver, having an electronic circuit, the circuit comprising:
       a forward transmission path;
       feedback means coupled across the forward path;
       an error amplifier having an offset voltage; and
       auto-zero circuit for forcing the output to accurately follow a desired DC voltage independent of the offset voltage.

17. The communication device of claim 16, wherein the electronic circuit includes a filter.

* * * * *